(12) United States Patent
Shen et al.

(10) Patent No.: US 9,276,173 B2
(45) Date of Patent: Mar. 1, 2016

(54) LIGHT-EMITTING DEVICE

(71) Applicant: Epistar Corporation, Hsinchu (TW)

(72) Inventors: Chien-Fu Shen, Hsinchu (TW);
Cheng-Ta Kuo, Hsinchu (TW);
Wei-Shou Chen, Hsinchu (TW);
Tsung-Hsien Liu, Hsinchu (TW);
Yi-Wen Ku, Hsinchu (TW); Min-Hsun Hsieh, Hsinchu (TW)

(73) Assignee: Epistar Corporation (TW)

(*) Notice: Subject to any disclaimer, the term of this patent is extended or adjusted under 35 U.S.C. 154(b) by 0 days.

(21) Appl. No.: 14/474,633

(22) Filed: Sep. 2, 2014

(65) Prior Publication Data

US 2014/0367733 A1 Dec. 18, 2014

Related U.S. Application Data (63) Continuation of application No. 13/459,342, filed on Apr. 30, 2012, now Pat. No. 8,823,039, which is a continuation of application No. 12/292,593, filed on Nov. 21, 2008, now Pat. No. 8,188,505.

(30) Foreign Application Priority Data

Nov. 23, 2007 (TW) .............................. 96144680 A (51) Int. Cl.
| | |
|---|---|
| *H01L 33/38* | (2010.01) |
| *H01L 23/00* | (2006.01) |
| *H01L 33/20* | (2010.01) |
| *H01L 33/62* | (2010.01) |

(52) U.S. Cl.
CPC ................ *H01L 33/38* (2013.01); *H01L 24/02* (2013.01); *H01L 33/20* (2013.01); *H01L 33/62* (2013.01); *H01L 2224/48463* (2013.01)

(58) Field of Classification Search
CPC ................................. H01L 33/38; H01L 33/20
See application file for complete search history.

(56) References Cited

U.S. PATENT DOCUMENTS

| | | | | |
|---|---|---|---|---|
| 6,307,218 B1* | 10/2001 | Steigerwald et al. | ............ | 257/99 |
| 6,380,564 B1* | 4/2002 | Chen et al. | ....................... | 257/99 |
| 6,518,598 B1* | 2/2003 | Chen | ................................. | 257/91 |
| 6,614,056 B1* | 9/2003 | Tarsa et al. | ....................... | 257/91 |
| 6,881,985 B2* | 4/2005 | Murakami et al. | .............. | 257/99 |
| 7,429,755 B2* | 9/2008 | Hsu | .................................. | 257/81 |
| 7,598,531 B2* | 10/2009 | Erchak et al. | .................... | 257/91 |
| 7,795,610 B2* | 9/2010 | Kim et al. | ......................... | 257/35 |
| 7,888,687 B2* | 2/2011 | Miki | ................................ | 257/79 |
| 7,935,979 B2* | 5/2011 | Shum et al. | ..................... | 257/99 |
| 2004/0012958 A1* | 1/2004 | Hashimoto et al. | ............ | 362/241 |

(Continued)

*Primary Examiner* — Michael Lebentritt
*Assistant Examiner* — Jordan Klein
(74) *Attorney, Agent, or Firm* — Bacon & Thomas, PLLC (57) ABSTRACT

A light-emitting device comprises: a light-emitting stack having an upper side, a first edge having an end point, and a second edge opposite to the first edge; a first bonding region arranged on the upper side, near the first edge, and far from the end point; a second bonding region separated from to the first bonding region by a first distance and being far from the end point; a third bonding region arranged on the upper side; a fourth bonding region separated from the third bonding region by a second distance longer than the first distance; a first electrode connected to the first bonding region; a second electrode connected to the second bonding region; a third electrode connected to the third bonding region; a fourth electrode connected to the fourth bonding region; and a fifth electrode connected to the first bonding region and pointing to the fourth bonding region.

17 Claims, 12 Drawing Sheets

(56) References Cited

U.S. PATENT DOCUMENTS

| | | | |
|---|---|---|---|
| 2004/0061123 A1* | 4/2004 | Shelton et al. | 257/99 |
| 2004/0140473 A1* | 7/2004 | Chen | 257/79 |
| 2006/0192223 A1* | 8/2006 | Lee et al. | 257/99 |
| 2006/0289881 A1* | 12/2006 | Chen et al. | 257/91 |
| 2007/0085095 A1* | 4/2007 | Ko et al. | 257/94 |
| 2008/0210972 A1* | 9/2008 | Ko et al. | 257/99 |
| 2008/0241526 A1* | 10/2008 | Ou et al. | 428/336 |
| 2008/0296603 A1* | 12/2008 | Chu | 257/99 |
| 2009/0127578 A1* | 5/2009 | Masuya | 257/98 |
| 2009/0159909 A1* | 6/2009 | Lee et al. | 257/96 |
| 2009/0179211 A1* | 7/2009 | Yoo et al. | 257/98 |

* cited by examiner

FIG.1A (Conventional LED)

FIG.1B (Conventional LED)

FIG.2 (Conventional LED)

FIG.3 (Conventional LED)

FIG.4 (Conventional LED)

LIGHT-EMITTING DEVICE

REFERENCE TO RELATED APPLICATION

This application is a continuation application of U.S. patent application Ser. No. 13/459,342, entitled "Light-emitting device", filed on Apr. 30, 2012, which is a continuation application of U.S. patent application Ser. No. 12/292,593, entitled "Light-emitting device", filed on Nov. 21, 2008, and the content of which is hereby incorporated by references.

BACKGROUND OF THE DISCLOSURE

1. Technical Field

The present invention relates to a light-emitting device, and in particular to a semiconductor light-emitting device.

2. Description of the Related Art

The light-emitting mechanism and the structure of a light-emitting diode (LED) are different from that of the conventional light sources. The LED has advantages of small size and high reliability, and has been widely used in different fields such as displays, laser diodes, traffic lights, data storage apparatus, communication apparatus, lighting apparatus, and medical apparatus.

Figure 1A:
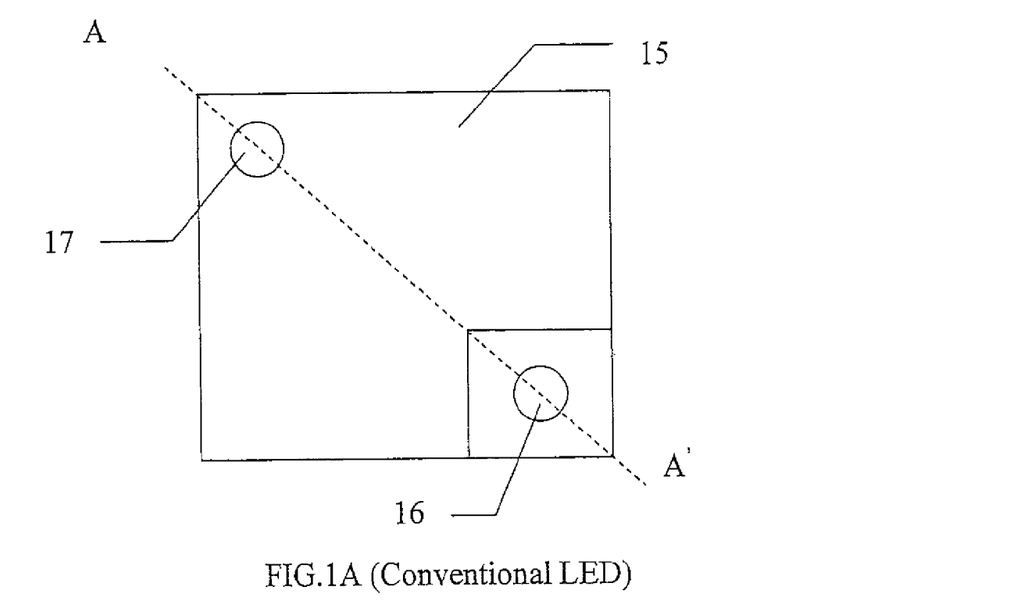
FIGS. 1A-1B are a schematic top view and a cross-sectional view of a conventional light-emitting device 1.
Figure 1B:
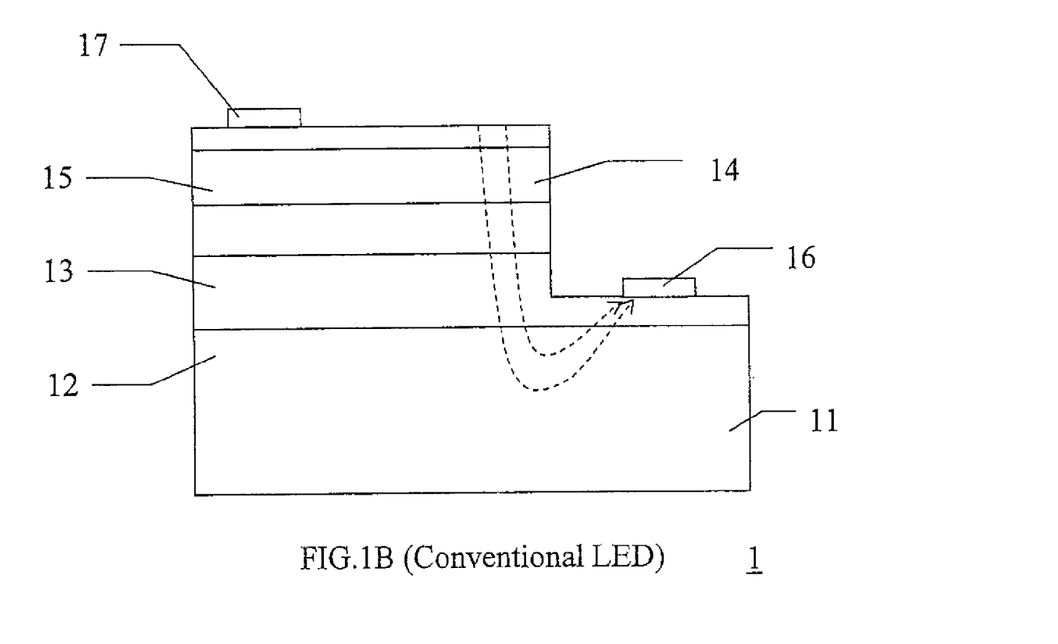

Referring to FIGS. 1A and 1B. FIG. 1A is the schematic top view of a conventional nitride-based light-emitting device 1, and FIG. 1B illustrates a cross-sectional view of the conventional nitride-based light-emitting device 1 along the A-A' line in the FIG. 1A. The conventional nitride-based light-emitting device 1 includes a substrate 11, an n-type nitride-based layer 12, a light-emitting layer 13, a p-type nitride-based layer 14, a p-type transparent electrode 15, an n-type electrode 16 having the function as a bonding pad, and a p-type bonding pad 17. The p-type bonding pad 17 is used for current injection. The current is injected through the p-type bonding pad 17 and moves to and spread through the p-type transparent electrode 15. Electrons and holes recombine in the light-emitting layer 13 and then produce photons. In fact, as shown in FIG. 1B, the current is crowded in the area where the p-type transparent electrode 15 is close to the n-type electrode 16 to cause a poor light-emitting efficiency. Besides, the temperature in the current crowded area is so high that the life of conventional nitride-based light-emitting device 1 is reduced.

Figure 2:
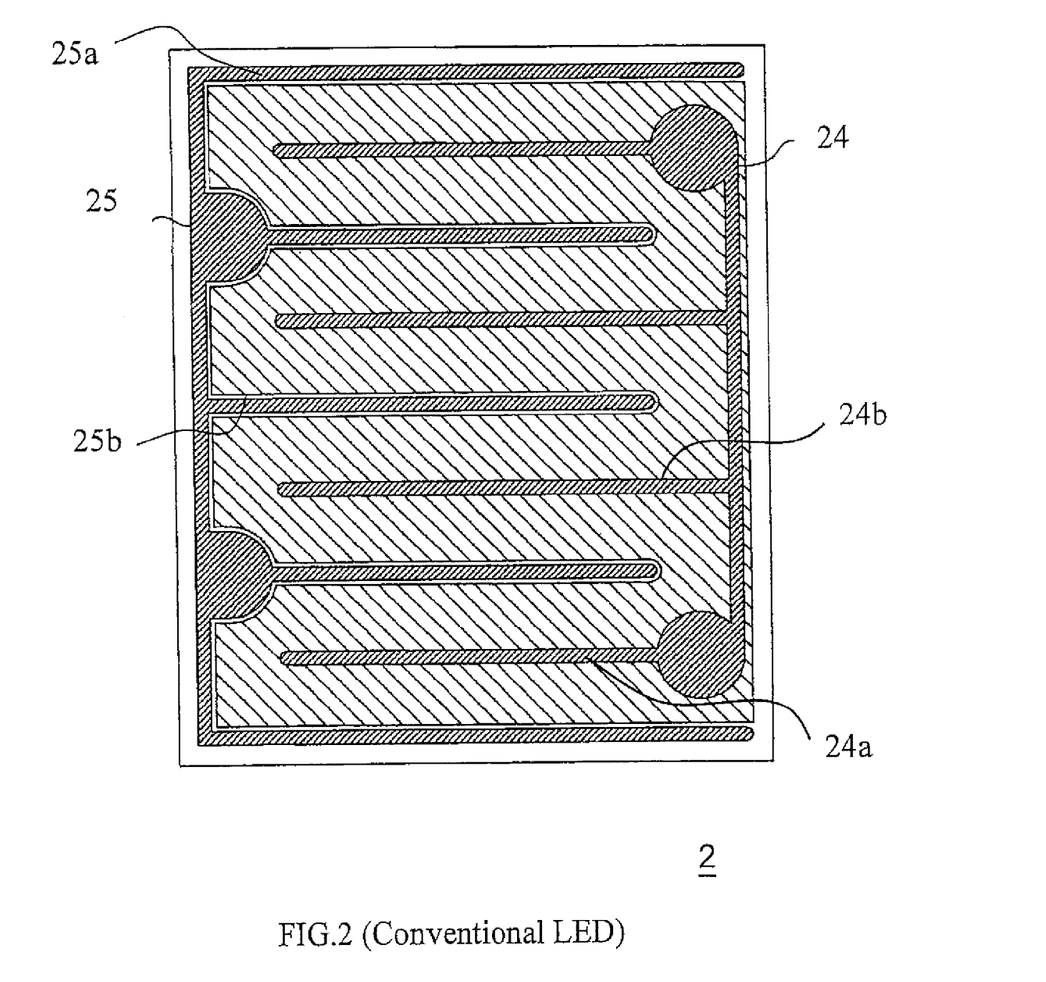
FIG. 2 is a schematic cross-sectional view of a conventional light-emitting device 2.
Figure 3:
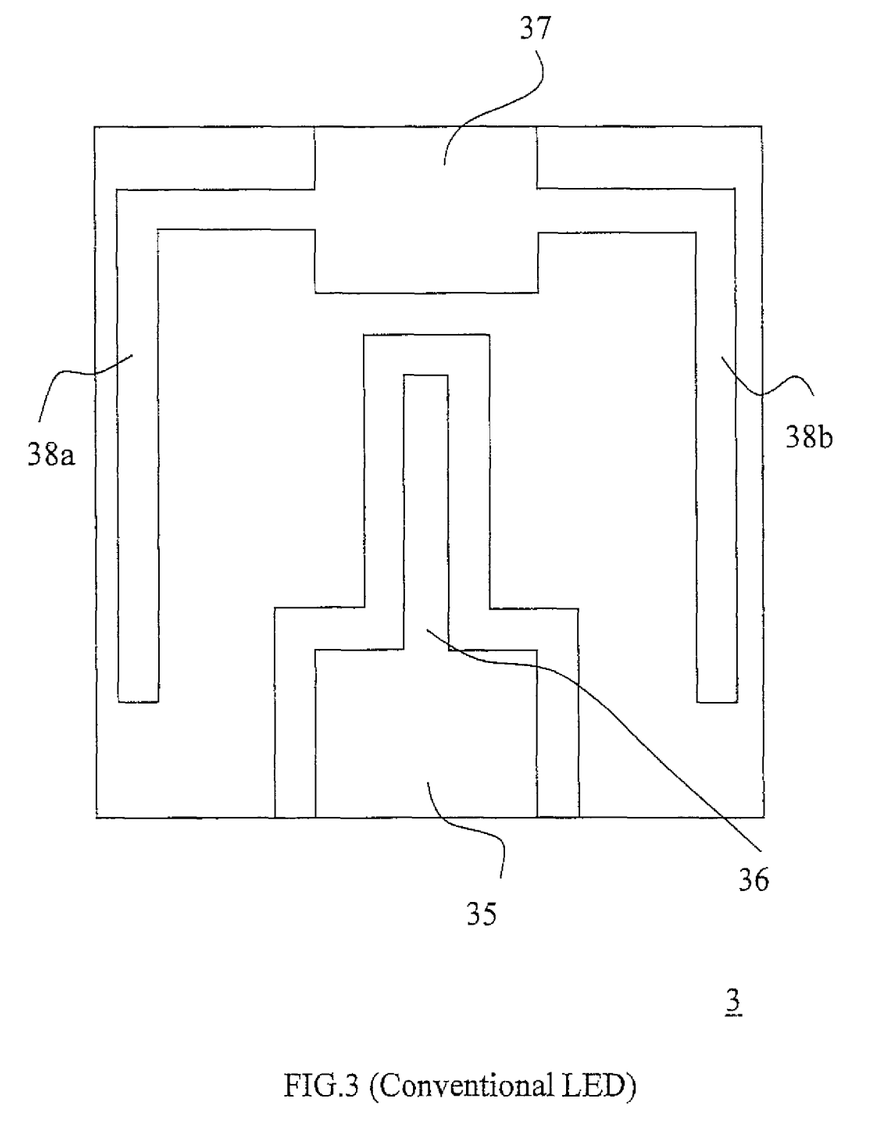
FIG. 3 is a schematic cross-sectional view of a conventional light-emitting device 3.

In order to resolve above problems, a known art disclosed a light-emitting device 2 which is illustrated by a top view as shown in FIG. 2. Another known art also disclosed a light-emitting device 3 which is illustrated by a top view as shown in FIG. 3. Referring to FIG. 2, the light-emitting device 2 includes a p-type electrode and an n-type electrode. The p-type electrode includes a p-type bonding pad 24, two first armed electrodes 24a extending from the p-type bonding pad 24, and second armed electrodes 24b interposed between two first armed electrodes 24a. The armed electrode can be used to decrease the light absorption of the p-type electrode. The current is injected from the p-type bonding pad 24 and spread by the armed electrodes. The n-type electrode includes an n-type bonding pad 25, third armed electrodes 25a, and fourth armed electrodes 25b. The current is injected from the p-type electrode, moves to the light-emitting region of the light-emitting device 2, and then flows to and out of the n-type electrode. The p-type armed electrodes 24a, 24b and the n-type armed electrodes 25a, 25b are interdigitated between each other.

Referring to the FIG. 3, the light-emitting device 3 includes an n-type electrode having a first contact 35 and an n-type fingered electrode 36 connected with the first contact 35 at a first side of the light-emitting device 3, a p-type electrode having a second contact 37 and two fingered electrodes 38a, 38b connected with the second contact 37 at a second side of the light-emitting device 3, wherein the first side and the second side are opposite to each other. The n-type fingered electrode 36 is extended from the first side to the second side, the p-type fingered electrodes 38a, 38b are extended from the second side to the first side, and the n-type fingered electrode 36 and the p-type fingered electrodes 38a, 38b are interdigitated between each other. The light-emitting devices 2 and 3 can resolve the current crowding and low light efficiency problems of the conventional light-emitting device 1 by the interdigitated extending electrodes.

Figure 4:
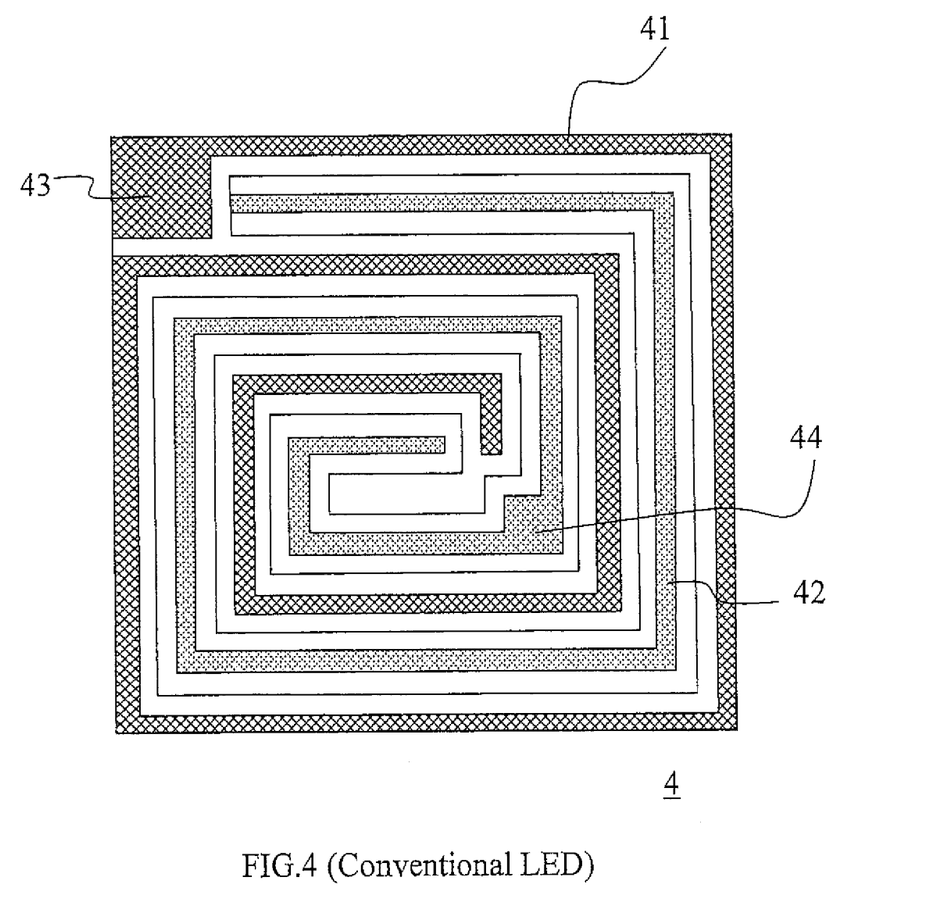
FIG. 4 is a schematic cross-sectional view of a conventional light-emitting device 4.

Referring to FIG. 4, further another known art disclosed a light-emitting device 4. The epitaxial structure of the light-emitting device 4 includes a spiral-shaped trench, a p-type metal electrode 41 located in the exposed surface of the trench, an n-type metal electrode 42 located on the un-trenched surface of the epitaxial structure, a p-type bonding pad 43, and an n-type bonding pad 44, wherein the p-type metal electrode 41 and the n-type metal electrode 42 are parallel and distributed in spiral shape, which can resolve the current crowding and low light efficiency problems of the conventional light-emitting device 1

In above conventional light-emitting devices, the designs of electrodes adopt transparent electrodes or decrease the electrode area such as armed, fingered and spiral-shaped electrodes to optimize the light extraction area. In general, the width of an electrode is designed to be smaller than that of a bonding pad to avoid increasing the light absorption area of the electrode.

SUMMARY OF THE DISCLOSURE

A light-emitting device comprises: a light-emitting stack having an upper side, a first edge having an end point, and a second edge opposite to the first edge; a first bonding region arranged on the upper side, near the first edge, and far from the end point; a second bonding region separated from to the first bonding region by a first distance and being far from the end point; a third bonding region arranged on the upper side; a fourth bonding region separated from the third bonding region by a second distance longer than the first distance; a first electrode connected to the first bonding region; a second electrode connected to the second bonding region; a third electrode connected to the third bonding region; and a fourth electrode connected to the fourth bonding region; and a fifth electrode connected to the first bonding region and pointing to the fourth bonding region.

A light-emitting device comprises: a light-emitting stack having an upper side, a first edge having an end point, and a second edge opposite to the first edge; a first bonding region arranged on the upper side, near the first edge, and far from the end point; a second bonding region separated from to the first bonding region by a first distance and being far from the end point; a third bonding region arranged on the upper side; a fourth bonding region separated from the third bonding region by a second distance longer than the first distance; a first electrode connected to the first bonding region; a second electrode connected to the second bonding region; a third electrode connected to the third bonding region; a fourth electrode connected to the fourth bonding region; a fifth electrode connected to the first bonding region; and a sixth electrode connected to the second bonding region and separated from the fifth electrode.

A light-emitting device comprises: a light-emitting stack having an upper side, a first edge and a second edge; a first bonding region arranged on the upper side and near the first edge; a second bonding region arranged on the upper side and near the first edge; a third bonding region arranged on the upper side and distanced from the first edge; a fourth bonding region arranged on the upper side and distanced from the first edge; a first electrode connected to the first bonding region; a second electrode connected to the second bonding region; a third electrode connected to the third bonding region; a fourth electrode connected to the fourth bonding region; a fifth electrode connected to the first bonding region; and a sixth electrode connected to the second bonding region and separated from the fifth electrode; wherein the fifth electrode and the sixth electrode are between the third bonding region and the fourth bonding region.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Reference will now be made in detail to the preferred embodiments of the present invention, examples of which are illustrated in the accompanying drawings. Wherever possible, the same reference numbers are used in the drawings and the description to refer to the same or like parts.

Figure 5A:
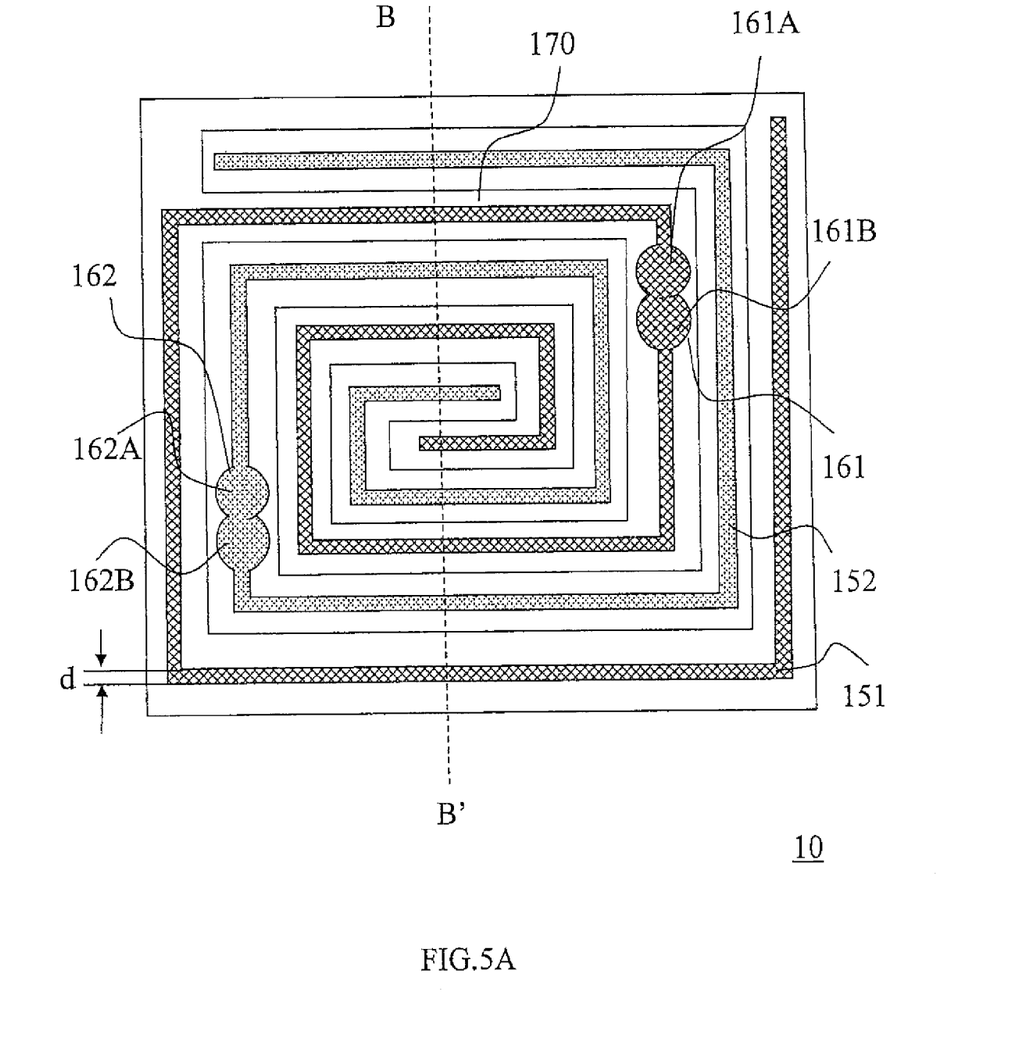
FIGS. 5A-5C are a schematic top view and cross-sectional views of a light-emitting device in accordance with a first embodiment of the present invention.
Figure 5B:
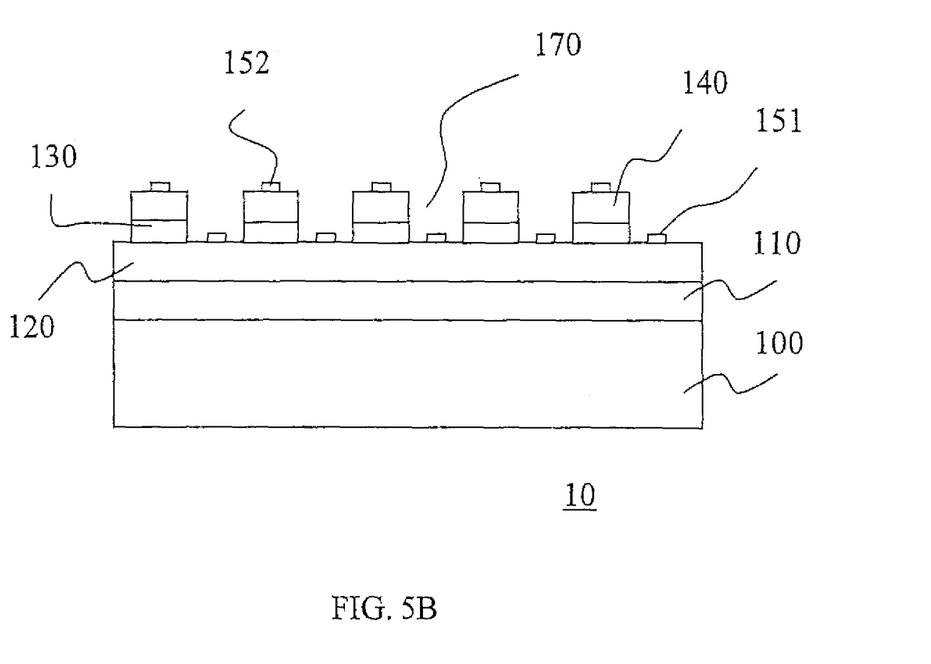

Referring to FIG. 5A, the schematic top view shows a light-emitting device 10 in accordance with a first embodiment of the present invention. FIG. 5B illustrates a cross-sectional view of the light-emitting device 10 along the B-B' line in the FIG. 5A. The light-emitting device 10 such as an LED includes a substrate 100, a buffer layer 110, a first semiconductor layer 120, a light-emitting layer 130, a second semiconductor layer 140, a first electrode 151, a second electrode 152, a first and second pad 161 and 162. In the embodiment, the shape of light-emitting device 10 is a rectangular cube. Each side of the light-emitting device 10 is about 610 μm in length. The area of the top surface is $3.72\times10^5$ μm$^2$, and the area of the light-emitting layer 130 is accorded with the area of the top surface. The buffer layer 110, first semiconductor layer 120, light-emitting layer 130, and second semiconductor layer 140 are formed on the substrate 100 by the method of metal organic chemical vapor deposition (MOCVD) or molecular-beam epitaxy (MBE).

After forming the epitaxial structure, an etching step is performed. A trench 170 is formed in the epitaxial structure by etching the epitaxial structure. A part of the first semiconductor layer 120 is exposed through the trench 170. The trench 170 is formed in a rectangular spiral shape, and the un-etched epitaxial structure is also formed in a rectangular spiral shape.

Next, the first electrode 151 and the first pad 161 are formed on the exposed surface of the first semiconductor layer 120. The shape of first electrode 151 is the same as the rectangular spiral shape of the trench 170, and the width of the first electrode 151 is about 22 μm. The position of first pad 161 can be between two end points of the first electrode 151 or in a non-end portion of the first electrode 151. In this embodiment, the first pad 161 is disposed at the non-end portion of the first electrode 151. Because the light-emitting device 10 has a larger light-emitting area, a larger operating current is necessary for a higher emitting efficiency. In order to achieve the larger amount of injected current, more pads area for current injecting are necessary. In this embodiment, the area of the first pad 161 is designed to be capable of containing at least two wires for current injecting, and the light-emitting device has enough wires for current injecting to improve the light-emitting efficiency. The first pad 161 has an area between $1.5\times10^4$ μm$^2$ to $6.2\times10^4$ μm$^2$. The area of the first pad 161 is $1.9\times10^4$ μm$^2$ in the embodiment.

Further, the second electrode 152 and the second pad 162 are formed and connected with each other on the remained epitaxial structure. The width of the second electrode 152 is about 20 μm, and the shape of it is a rectangular spiral. The second pad 162 can be situated between two end points of the second electrode 152 or on a non-end portion of the second electrode 152. In this embodiment, the second pad 162 is situated on the non-end portion of the second electrode 152. Similarly, in order to achieve a larger injected current, in this embodiment, the area of the second pad 162 is designed to be capable of containing at least two wires for current injecting, thus the light-emitting device has enough amounts of wires for current injecting to improve the light-emitting efficiency. The second pad 162 has an area between $1.5\times10^4$ μm$^2$ to $6.2\times10^4$ μm$^2$. The area of the second pad 162 is $1.73\times10^4$ μm$^2$ in the embodiment.

Figure 5C:
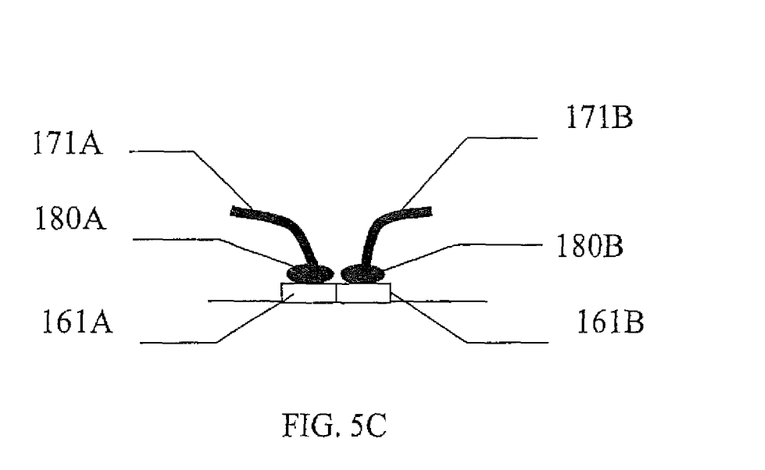

The shapes of the first pad 161 and the second pad 162 include rectangular shape, circular shape, or any other shapes. The first pad 161 and the second pad 162 including bonding regions are disposed on the first and the second electrodes respectively. In the embodiment, both shapes of the first pad 161 and the second pad 162 are two overlapped circles. Bonding regions 161A and 161B of the first pad 161, and bonding regions 162A and 162B of the second pad 162 can provide a better identification and avoid duplicate bonding of two wires on the same pad. There are wires connecting to the bonding regions 161A, 161B, 162A, and 162B respectively so the light-emitting device receives enough current by wires to have sufficient electrons and holes to recombine and then emits light. Referring to FIG. 5C, the schematic cross-sectional view shows a pad 161 with Au bonding bulges 180A and 180B formed on the bonding regions 161A and 161B respectively. During the bonding process, Au bulges are melted by raising temperature, and then the wires 171A and 171B are bonded with Au bonding bulges 180A and 180B respectively. Similarly, other two wires are bonded at the bonding regions 162A and 162B by the same method.

The direction of the spiral shape is clockwise or counter-clockwise, and the numbers of spiral are not limited. The material of the substrate 100 includes but is not limited to sapphire. The material of the buffer layer 110 includes but is not limited to AlN, AlGaN, or GaN. The material of the first semiconductor layer 120 includes but is not limited to $(Al_xGa_{1-x})_yIn_{1-y}N$ wherein $0 \leq x \leq 1$ and $0 \leq y \leq 1$. The light-emitting layer 130 includes but is not limited to a double heterostructure or a multi-quantum well including materials such as $(Al_pGa_{1-p})_qIn_{1-q}N$ wherein $0 \leq p \leq 1$ and $0 \leq q \leq 1$. The material of the second semiconductor layer 140 includes but is not limited to $(Al_aGa_{1-a})_bIn_{1-b}N$ wherein $0 \leq a \leq 1$ and $0 \leq b \leq 1$.

The material of the first electrode 151 is selected from materials which can be formed an ohmic contact with the first semiconductor layer 120, such as a single layer, multiple layers or alloy selected from Ti, Al, and Au, or other metal-oxide conductive material. The first pad 161 includes but is not limited to a single layer, multiple layer or alloy selected from Ti, Al, and Au. The material of the second electrode 152 is selected from materials which can be formed an ohmic contact with the second semiconductor layer 140, such as a single layer, multiple layers or alloy selected from Ni and Au, or other metal-oxide conductive material. The second pad 162 includes but is not limited to a single layer, multiple layer or alloy selected from Ni and Au.

The areas of the first pad 161 and the second pad 162 do not need to satisfy the condition of having the area capable of accommodating at least two wires for current injecting at the same time. It can be one of the first pad 161 and the second pad 162 satisfying the condition that the area of pad is capable of containing at least two wires.

Figure 6A:
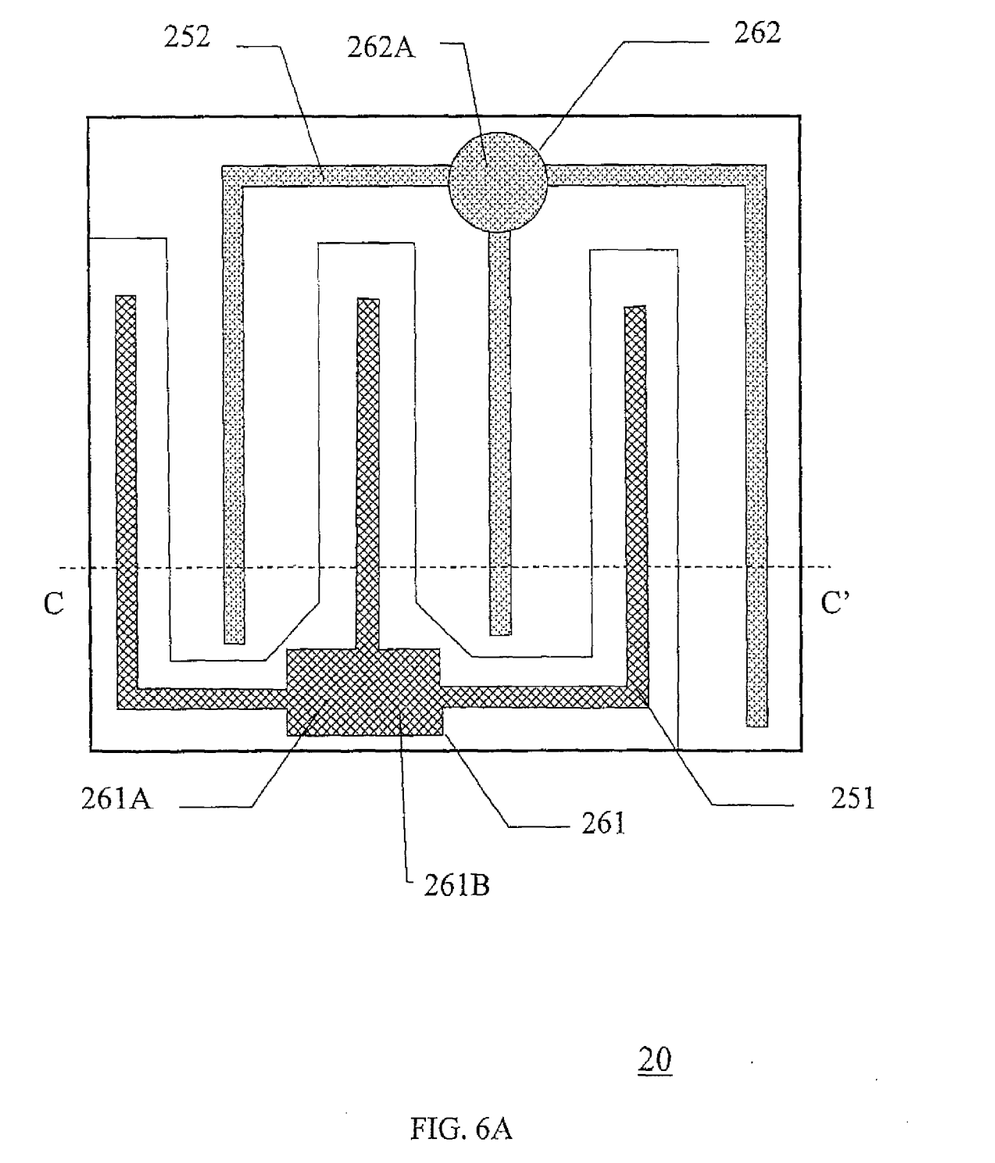
FIGS. 6A-6B are a schematic top view and a cross-sectional view of a light-emitting device in accordance with a second embodiment of the present invention.
Figure 6B:
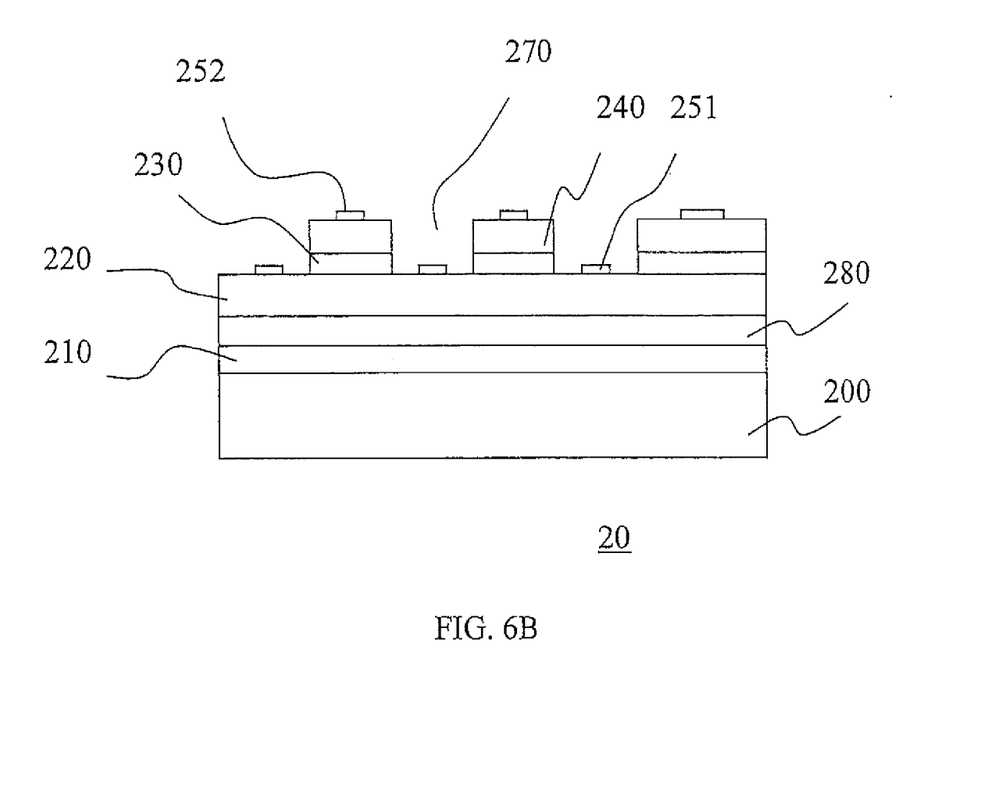

Referring to FIG. 6A, the schematic top view shows a light-emitting device 20 in accordance with a second embodiment of the present invention. FIG. 6B illustrates a cross-sectional view of the light-emitting device 20 along the C-C' line in the FIG. 6A. The light-emitting device 20 includes a substrate 200, an adhesive layer 210, a current conductive layer 280, a first semiconductor layer 220, a light-emitting layer 230, a second semiconductor layer 240, a first electrode 251, a second electrode 252, a first and second pad 261 and 262. In the embodiment, the shape of the light-emitting device 20 is a rectangular cube, and the length of each side is about 787 µm. The area of the top surface is $6.19 \times 10^5$ µm², and the area of the light-emitting layer 230 is in accord with the area of the top surface. The epitaxial structure of the light-emitting device 20 is formed on a growth substrate (not illustrated). After the epitaxial structure is grown, a current conductive layer 280 with a high current conductivity is formed on the first semiconductor layer 220, which can spread the current injected from the electrode. Next, the epitaxial structure and the substrate 200 are adhered together by the adhesive layer 210.

After the adhering step, a trench 270 is formed in the epitaxial structure by etching the epitaxial structure. A part of the current conductive layer 280 is exposed through the trench 270. The trench 270 is formed in a fingered shape; the finger is extended from the first side to the opposite second side of the light-emitting device 20. The un-etched epitaxial structure also forms a fingered shape.

Next, the first electrode 251 and the first pad 261 are formed on the exposed surface of the current conductive layer 280. The shape of the first electrode 251 is the same as the fingered shape of the trench 270, and the first electrode 251 includes at least three linearly extending electrodes and a laterally extending electrode connected the three linearly extending electrodes. The first electrode 251 has a width smaller than or equal to 25 µm. In this embodiment, the width of the first electrode 251 is about 23 µm. The first pad 261 can be situated between two end points of the first electrode 251 or on a non-end portion of the first electrode 251. In this embodiment, the first pad 261 is situated on the non-end portion of the first electrode 251. Similarly, in order to achieve a higher emitting efficiency, in this embodiment, the area of the first pad 261 is designed to be capable of containing at least two wires for current injecting so the light-emitting device 20 has enough wires for current injection. The area of the first pad 261 is $2.15 \times 10^4$ µm² in the embodiment.

Further, the second electrode 252 and the second pad 262 are formed and connected with each other on the remained epitaxial structure. The second electrode 252 includes three linearly extending electrodes extended from the second side to the opposite first side of the light-emitting device 20, and interdigitated between the three linearly extending electrode of the first electrode 251, and a laterally extending electrode connecting the three linearly extending electrodes. The second electrode 252 has a width smaller than or equal to 25 µm. In this embodiment, the width of the second electrode 252 is about 20 µm. The second pad 262 is disposed at the second side and connected with the second electrode 252. The area of the second pad 262 is $1.27 \times 10^4$ µm² in the embodiment.

In this embodiment, the shape of the second pad 262 is rectangular, and the second pad 262 is situated on the non-end portion of the second electrode 152. The first pad 261 is capable of containing two bonding regions 261A and 261B. Each of regions 261A and 261B electrically connects to at least a wire for bonding, such that a better identification can be achieved for the next bonding procedure to avoid different wires being bonded at the same bonding region. The second pad 262 has a circular shape, and only one bonding region 262A which connects to a wire electrically. The area of the second pad 262 is also can be designed as an size containing at least two wires, such as the area of the second pad 262 is $1.5 \times 10^4$ µm².

The material of the growth substrate includes but is not limited to sapphire, SIC, GaN, GaAs, or GaP. The material of the substrate 200 includes but is not limited to SiC, GaN, GaP, Si, AlN, ZnO, MgO, $MgAl_2O_4$, GaAs, glass, sapphire, metal, or compound materials. The adhesive layer 210 includes a conductive adhesive layer or an insulating adhesive layer. The material of the conductive adhesive layer includes but is not limited to Ag, Au, Al, In, or Sn, or alloy of them, spontaneous conductive polymer, or polymer doped with metal like Al, Au, Pt, Zn, Ag, Ni, Ge, In, Sn, Ti, Pb, Cu, Pd, or other metals. The material of the insulating adhesive layer includes but is not limited to spin on glass (SOG), silicone, benzocyclobutene (BCB), epoxy, polyimide (PI), or perfluorocyclobutane (PFCB). When the adhesive layer 210 is the insulating adhesive layer, the material of the substrate 200 is not limited. In the embodiment, the material of the substrate 200 is Si. The material of Si has a higher heat transfer coefficient to transfer the heat produced by the light-emitting device to the environment. A reflective layer 211 is further disposed on one side of the adhesive layer 210. The material of the reflective layer 211 includes but is not limited to metal, oxide, or the combination thereof. The oxide material for the reflective layer 211 includes but is not limited to $AlO_x$, $SiO_x$, or $SiN_x$.

Figure 7:
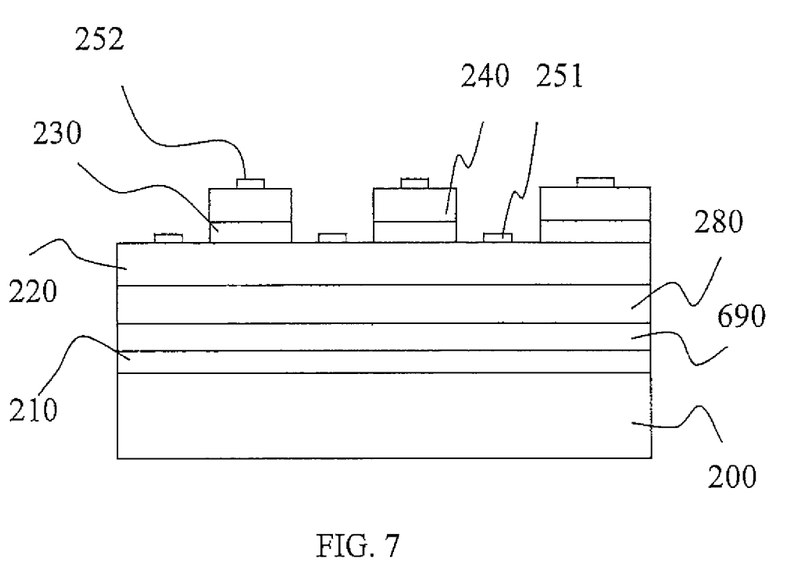
FIG. 7 is a schematic cross-sectional view of a light-emitting device in accordance with a third embodiment of the present invention.

When the adhesive layer 210 is the conductive adhesive layer, the material of the substrate 200 includes but is not limited to glass, sapphire, or AlN. It also can disposes an insulating layer between the current conductive layer 280 and the adhesive layer 210, or the adhesive layer 210 and the substrate 200, wherein the material of the substrate 200 is not limited. Referring to FIG. 7, a cross-sectional view shows a light-emitting device in accordance with a third embodiment of the present invention. FIG. 7 illustrates an insulating layer 690 disposed between the adhesive layer 210 and the current conductive layer 280 for isolation. The material of the insulating layer includes but is not limited to $SiN_x$ or $SiO_2$. The material of the first semiconductor layer 220 includes but is not limited to $(Al_mGa_{1-m})_rIn_{1-r}N$ wherein $0 \leq m \leq 1$ and $0 \leq r \leq 1$ or $(Al_cGa_{1-c})_dIn_{1-d}P$ wherein $0 \leq c \leq 1$ and $0 \leq d \leq 1$. The light-emitting layer 230 includes but is not limited to a double heterostructure or a multi-quantum well including materials such as $(Al_eGa_{1-e})_fIn_{1-f}N$ wherein $0 \leq e \leq 1$ and $0 \leq f \leq 1$ or $(Al_iGa_{1-i})_jIn_{1-j}P$ wherein $0 \leq i \leq 1$ and $0 \leq j \leq 1$. The material of the second semiconductor layer 240 includes but is not limited to $(Al_kGa_{1-k})_hIn_{1-h}N$ wherein $0 \leq k \leq 1$ and $0 \leq h \leq 1$ or $(Al_sGa_{1-s})_tIn_{1-t}P$ wherein and $0 \leq s \leq 1$ and $0 \leq t \leq 1$.

The material of the first electrode 251 includes but is not limited to a single metal layer, multiple metal layers or alloy of Ni, and Au, or other conductive metal oxide layer. The material of first pad 261 includes but is not limited to a single metal layer, multiple metal layers or alloy of Ni, and Au. The material of the second electrode 252 includes but is not limited to a single metal layer, multiple metal layers or alloy of Ti, Al, and Au, or conductive metal oxide layer. The second pad 262 includes but is not limited to a single metal layer, multiple metal layers or alloy of Ti, Al, and Au. The shapes of the first electrode 251 and the second electrode 252 include M linearly extending electrodes respectively, wherein $M \geq 1$. The first electrode 251 can include M linearly extending electrodes, wherein $M \geq 1$, and the second electrode 252 includes M−1 linearly extending electrodes.

Figure 8A:
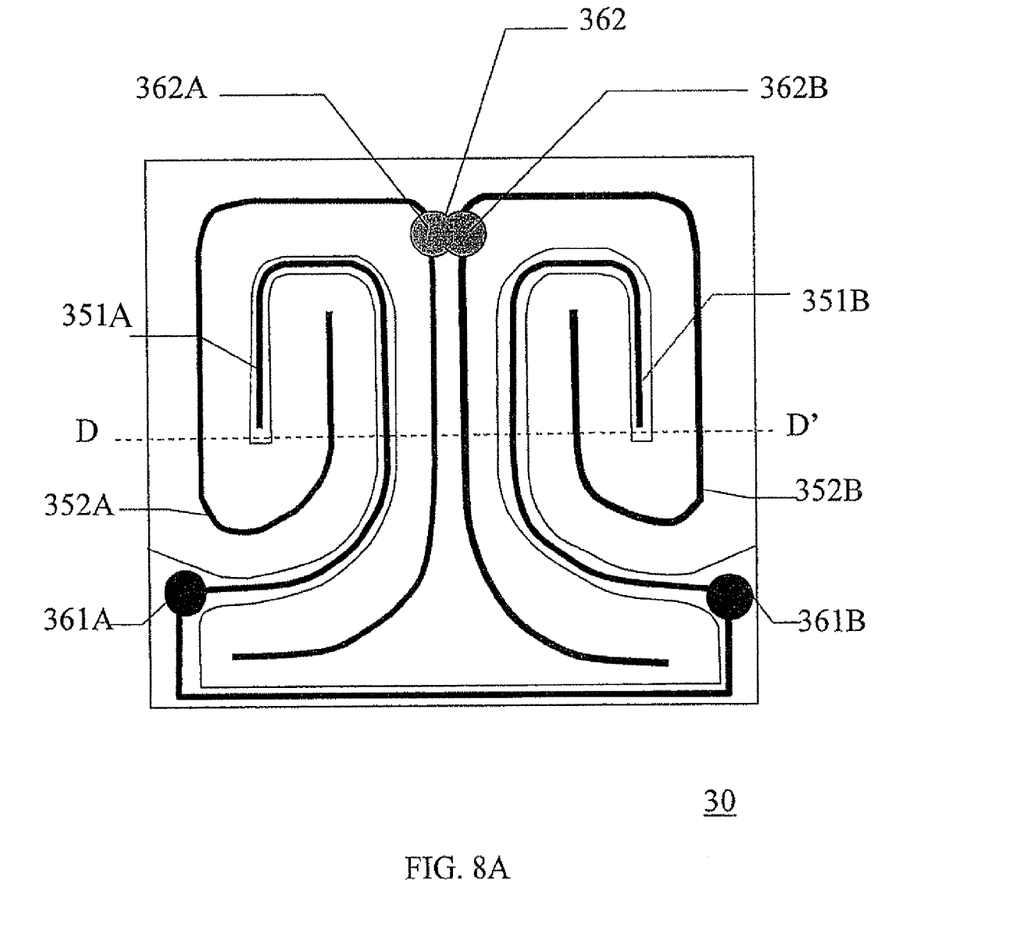
FIGS. 8A-8B are a schematic top view and a cross-sectional view of a light-emitting device in accordance with a fourth embodiment of the present invention.
Figure 8B:
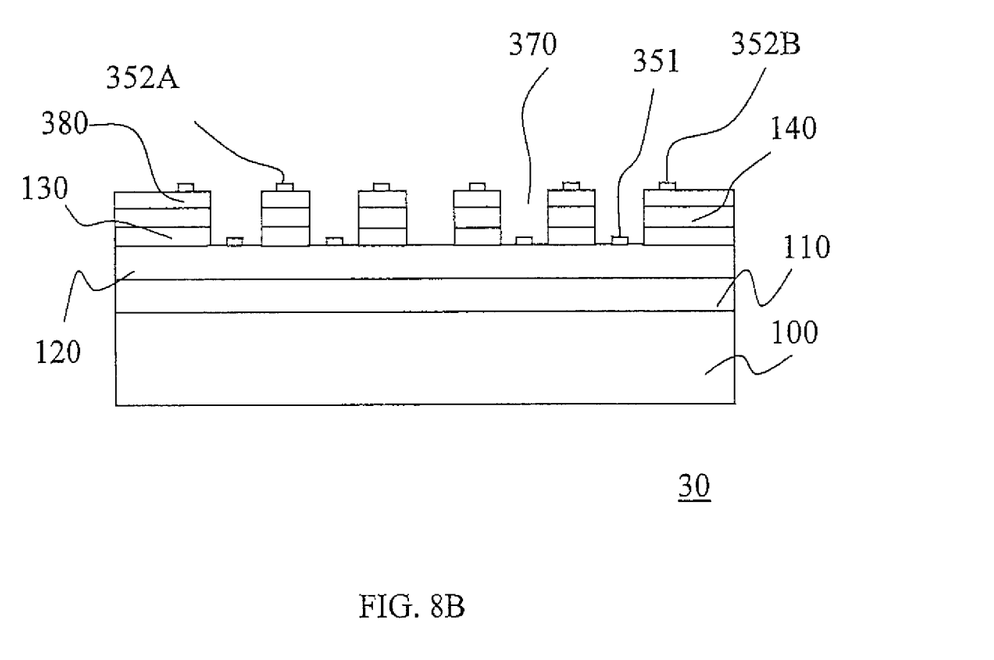

Referring to FIG. 8A, the schematic top view shows a light-emitting device 30 in accordance with a fourth embodiment of the present invention. FIG. 8B illustrates a cross-sectional view of the light-emitting device 30 along the D-D' line in the FIG. 8A. The structure of the light-emitting device 30 is similar to that of the light-emitting device 10 including a substrate 100, a buffer layer 110, a first semiconductor layer 120, a light-emitting layer 130, and a second semiconductor layer 140. After forming the epitaxial structure, a current conductive layer 380 is disposed on the second semiconductor layer 140. In the embodiment, the light-emitting device 300 is a rectangular cube and the length of each side of the light-emitting device 30 is about 1143 μm. The area of the top surface is $1.31 \times 10^6$ μm$^2$, and the area of the light-emitting layer 130 is in accord with the area of the top surface.

After the step of forming the current conductive layer 380, an etching step is performed. A trench 370 is formed in the current conductive layer 380 and the epitaxial structure by etching part of them. A part of the first semiconductor layer 120 is exposed through the trench 370. The shape of the trench 370 is formed in a pair of spiral, and the un-etched current conductive layer 380 and epitaxial structure are also formed in a pair of spiral shape.

Referring to FIG. 8A, the light-emitting device 30 includes a pair of first electrodes 351A and 351B and a pair of second electrodes 361A and 361B formed in a pair of spiral shape respectively. After the trench 370 is formed, the first electrodes 351A and 351B, and first pads 361A and 361B are formed on the exposed surface of the first semiconductor layer 120. The shape of first electrodes 351A and 351B are the same as the pair of spiral shape of the trench 370. The width of the first electrodes 351A or 351B is about 10 μm respectively. First pads 361A and 361B can be situated between two end points of first electrodes 351A and 351B or on a non-end portion of first electrodes 351A and 351B. In this embodiment, first pads 361A and 361B are situated on the non-end portions of first electrodes 351A and 351B near a first side of the light-emitting device 30 and a second side opposite to the first side. The area of first pad 361A and 361B are the same as $19 \times 10^4$ μm$^2$.

Further, the second electrodes 352A and 352B, and second pad 362 are formed on the remained current conductive layer 380. The width of the second electrode 352A or 352B is about 10 μm respectively. The second electrodes 352A and 352B are formed in a spiral shape and connected with the second pads 362 respectively. The second pad 362 can be disposed at a third side neighboring with the first side and the second side, and connect to second electrodes 352A and 352B. In this embodiment, the area of the second pad 362 is designed to be capable of containing at least two wires for current injection so the light-emitting device 30 has enough current to higher brightness. The area of the second pad 362 is $1.9 \times 10^4$ μm$^2$ in the embodiment.

In the embodiment, the shape of the second pad 362 formed as two circles partially overlapped includes two bonding region 362A and 362B such that a better identification can be achieved for the next bonding procedure to avoid two wires being bonded on the same bonding region. There are wires connecting to the bonding regions 361A, 361B, 362A, and 362B respectively, so the light-emitting device 30 receives enough current by wires to have sufficient electrons and holes to recombine and then emits light. The shape of the light-emitting device 30 includes but is not limited to a square shape or a rectangular shape. The material of the current conductive layers 280 and 380 includes but is not limited to indium tin oxide, cadmium tin oxide, zinc oxide, or zinc tin oxide. Each surface of the light-emitting device can be a rough surface by an epitaxial or an etching process, such as a rough surface around the substrate or around the epitaxial structure, a rough surface in the top light extraction surface, or a rough surface under and contact with the electrode, to improve the light extraction efficiency.

Figure 9:
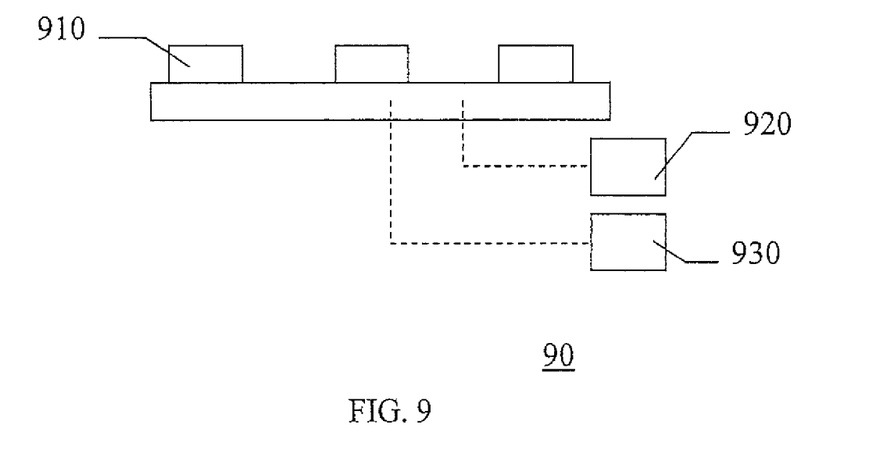
FIG. 9 is a schematic cross-sectional view of a light source element including a light-emitting device of the present invention.

Referring to FIG. 9, the schematic cross-sectional view shows a light source apparatus 90 in accordance with a fifth embodiment of the present invention. The light source apparatus 90 includes a light-emitting device of above embodiments. The light source apparatus 7 is a lighting apparatus such as streetlamps, vehicle lamps, or indoor lightings. It also can be traffic lights or backlights of a module in a planar display. The light source apparatus 90 includes a light source 910 with the light-emitting device of above embodiments, a power supply system 920, and a control element 930 for controlling the power supply system 920.

Figure 10:
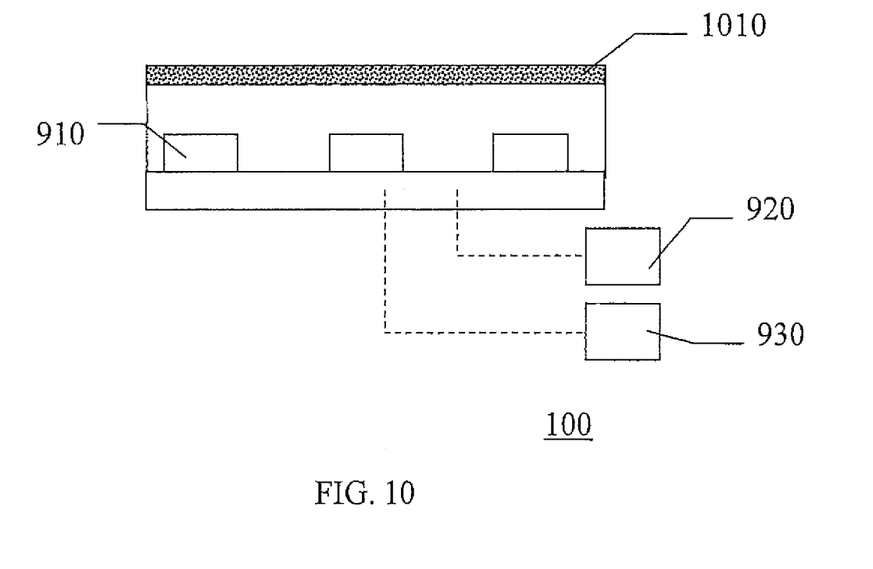
FIG. 10 is a schematic cross-sectional view of a backlight module including a light-emitting device of the present invention.

Referring to FIG. 10, the schematic cross-sectional view shows a backlight module 100 in accordance with an eighth embodiment of the present invention. The backlight module 100 includes the light source apparatus 90 and an optical element 1010. The optical element 1010 is used to operate the light emitted from the light source apparatus 90 to satisfy the requirements of the backlight. The optical element 1010 includes a photonic lattice, a color filter, a wavelength conversion layer, an antireflective layer 211, a lens or the combination thereof.

It will be apparent to those skilled in the art that various modifications and variations can be made to the structure of the present invention without departing from the scope or spirit of the invention. In view of this, it is intended that the present invention covers modifications and variations of this invention provided they fall within the scope of the following claims and their equivalents.

What is claimed is:

1. A light-emitting device comprising:
   a light-emitting stack having an upper side, a first edge and a second edge opposite to the first edge;
   a first bonding region arranged on the upper side and near the first edge;
   a second bonding region separated from the first bonding region by a first distance;
   a third bonding region arranged on the upper side;
   a fourth bonding region separated from the third bonding region by a second distance longer than the first distance;
   a first electrode connected to the first bonding region;
   a second electrode connected to the second bonding region;
   a third electrode connected to the third bonding region;
   a fourth electrode connected to the fourth bonding region;
   a fifth electrode connected to the first bonding region and pointing to the fourth bonding region; and
   a trench formed in the light-emitting stack; wherein the third bonding region and the fourth bonding region are formed in the trench.

2. The light-emitting device of claim 1, wherein the first electrode has a spiral shape different from that of the second electrode.

3. The light-emitting device of claim 1, wherein the first bonding region and the second bonding region are close to the first edge, the third bonding region and the fourth bonding region are close to the second edge.

4. The light-emitting device of claim 1, further comprising a sixth electrode connected to the second bonding region and pointing to the third bonding region.

5. The light-emitting device of claim 1, further comprising a sixth electrode connected to the second bonding region and separated from the fifth electrode.

6. The light-emitting device of claim 1, wherein the first electrode or the second electrode comprises a linearly extending electrode and a laterally extending electrode.

7. The light-emitting device of claim 1, wherein the trench comprises a first area configured to accommodate the third bonding region and a second area configured to accommodate the fourth bonding region.

8. A light-emitting device comprising:
   a light-emitting stack having an upper side, a first edge and a second edge opposite to the first edge;
   a first bonding region arranged on the upper side and near the first edge;
   a second bonding region separated from the first bonding region by a first distance;
   a third bonding region arranged on the upper side;
   a fourth bonding region separated from the third bonding region by a second distance longer than the first distance;
   a first electrode connected to the first bonding region;
   a second electrode connected to the second bonding region;
   a third electrode connected to the third bonding region;
   a fourth electrode connected to the fourth bonding region;
   a fifth electrode connected to the first bonding region;
   a sixth electrode connected to the second bonding region and separated from the fifth electrode; and
   a trench formed in the light-emitting stack; wherein the third bonding region and the fourth bonding region are formed in the trench.

9. The light-emitting device of claim 8, wherein the first electrode has a spiral shape different from that of the second electrode.

10. The light-emitting device of claim 8, wherein the first bonding region and the second bonding region are close to the first edge, the third bonding region and the fourth bonding region are close to the second edge.

11. The light-emitting device of claim 8, wherein the first electrode or the second electrode comprises a linearly extending electrode and a laterally extending electrode.

12. The light-emitting device of claim 8, wherein the trench comprises a first area configured to accommodate the third bonding region and a second area configured to accommodate the fourth bonding region.

13. A light-emitting device comprising:
   a light-emitting stack having an upper side, a first edge and a second edge;
   a first bonding region arranged on the upper side and near the first edge;
   a second bonding region arranged on the upper side and near the first edge;
   a third bonding region arranged on the upper side and distanced from the first edge;
   a fourth bonding region arranged on the upper side and distanced from the first edge;
   a first electrode connected to the first bonding region;
   a second electrode connected to the second bonding region;
   a third electrode connected to the third bonding region;
   a fourth electrode connected to the fourth bonding region;
   a fifth electrode connected to the first bonding region; and
   a sixth electrode connected to the second bonding region and separated from the fifth electrode;
   wherein the fifth electrode and the sixth electrode are between the third bonding region and the fourth bonding region;
   wherein the second bonding region is distanced from the first bonding region by a first distance, and the third bonding region is distanced from the fourth bonding region by a second distance; and
   wherein a farthest distance between the first electrode and the second electrode along the first direction is shorter than the second distance.

14. The light-emitting device of claim 13, wherein the second distance is longer than the first distance in a first direction parallel to the first edge.

15. The light-emitting device of claim 14, wherein a fourth distance between respective ends of the first electrode and the second electrode is shorter than a fifth distance between respective ends of the third electrode and the fourth electrode along the first direction.

16. The light-emitting device of claim 13, wherein a section of the fifth electrode is parallel to a section of the sixth electrode.

17. The light-emitting device of claim 16, wherein the sections of the fifth electrode and the sixth electrode parallel to each other are perpendicular to the first edge.